CIRCUIT BOARD HAVING GROOVES TO LIMIT SOLDER FLOW

Filed Sept. 14, 1966

INVENTORS
Roger A. MacArthur
+ Osborne C. Dodson

Wesley B. Taylor 3,339,008

CIRCUIT BOARD HAVING GROOVES TO LIMIT SOLDER FLOW

Roger A. MacArthur, 724 S. Garfield, Hinsdale, Ill. 60521, and Osborne C. Dodson, 369 Bentleyville Road, Chagrin Falls, Ohio 44022

Filed Sept. 14, 1966, Ser. No. 579,407
5 Claims. (Cl. 174—68.5)

ABSTRACT OF THE DISCLOSURE

A solder board adapted to receive a plurality of electric components for integration into a circuit by soldering or the like, the board comprising an electrically non-conducting support having a plurality of spaced-apart soldering zones on one side. Each soldering zone comprises a patch adapted to be easily wetted by a melted solder composition or the like and effective to confine the melted solder composition within the areal confines of the patch. In the preferred embodiment, a network of grooves extends substantially over the surface of one side of the board between and among the soldering zones in such a manner as to isolate each such zone from the others; and/or each patch is depressed within one surface of the board to form an electrically insulating barrier of the board material which is thereby disposed laterally of and between each patch to minimize arcing.

So-called circuit boards of various construction are now in use. As an example, printed circuit boards, commonly known as universal boards, often have studs, pins, or terminals to which a hook-up wire or a lead wire from various electric components is connected. Alternately, spaced eyelets may be used. Such constructions are relatively expensive, and are not particularly feasible for connection to a large number of wires or leads. Further, such universal boards are often reused from time to time in different circuit arrangements. The conductive circuit portions are thereby repeatedly subjected to abuse, so that any tendency of the conductive portions to separate from an insulating backing is considerably accelerated, resulting in poor and improper electrical connections.

A further difficulty with a printed circuit is the weakness of the printed conductor portion of the circuit which is easily ruptured when the insulation cracks or when repairs are made. In one type of printed circuit board, conductive surface patterns are cemented to an insulating backing, the conductive patterns being arranged to permit different circuits to be formed for experimental or other use. To withstand the rigors of repeated use, the conductive surface pattern must be relatively thick or "heavy." Such patterns are quite apt to break free of the insulation material and entirely separate from the assembly.

A much more simplified circuit board resembles a "peg board," that is, a sheet having spaced holes. This type of circuit board is much less expensive to make, but it is much more difficult, tedious, and inconvenient to use. In practice, a worker shoves a bundle of wires through a given hole from one side of the sheet with the fond expectation that the wires will not separate or slip from the hole before melted solder can be applied to the common ends of the wires sticking from the opposite side of the sheet. Often this expectation is not realized.

The present solder board is designed to obviate the foregoing faults and to replace circuit boards for many applications. A solder board of this invention is not only economical to produce, but it is convenient to use and efficient in operation.

It is, therefore, a principal object of the present invention to provide an improved solder board.

Another object is to provide an improved solder board which permits facile, economical, and secure assembly of components to the board.

A further object is to provide a solder board in which leads of electric components are easily held by the board, free of other support, until the leads are otherwise secured by soldering or the like.

A still further object is to provide a solder board in which an electric circuit need not be completed through a conductive surface on the board but rather through a medium used to secure a lead to the board such as the solder itself.

Still further objects and advantages will be apparent from the following description and drawings wherein.

In accordance with the present invention, a solder board comprises an electrically non-conductive, non-solder-wettable support having two opposed sides and a plurality of spaced-apart soldering zones on one of such sides. Each soldering zone comprises a solder-wettable patch, preferably metallic. Each patch has at least three openings substantially aligned with openings extending through the non-conductive support to its opposite side. Each patch opening is of a size to receive but one electric lead extending from an electrical component mounted with respect to such opposite side of the non-conductive support. Accordingly, when a lead is inserted in one of the patch openings, the lead need not be manually held at that point until a subsequent operation.

It is emphasized that although in the preferred form of the invention the solder patch is metallic, this metallic patch is not needed nor used as an electro-conducting medium. It is mere coincidence that the soldering zone constitutes an electro-conductor. Instead, the metal is used because of its ability to be wetted by a melted solder composition and by its ability to aid in the fluxing action of such composition. Moreover, the petal patch of a soldering zone confines the flow of the fluid solder and "holds" it within the confines of the patch while preventing excessive flow and inadvertant dripping. When the solder has congealed, the electrical connection, in the preferred form of the invention, is effected through the resulting solidified solder cap sealed to the soldering zone and not necessarily through the metal of that zone. In this manner, the metal patch of the soldering zone can be quite thin, since it need not be thick enough to withstand the stresses and strains it would otherwise meet as an integral part of an electric circuit.

Various other modifications may be incorporated in the present solder board, either singly or in combination, to enhance the above described operation as will be apparent from the figures and following description.

Figure 1:
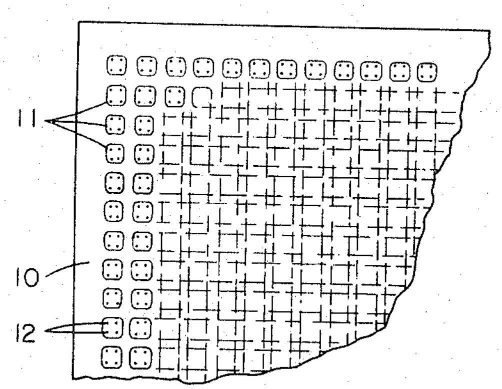
FIGURE 1 is a plan view of one side of a circuit board of the preseunt invention.
Figure 2:
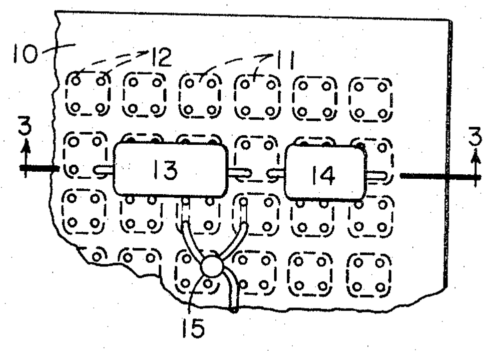
FIGURE 2 is an enlarged plan view of the opposite side of the circuit board of FIGURE 1 and shows the mounting thereon of electrical components.
Figure 3:
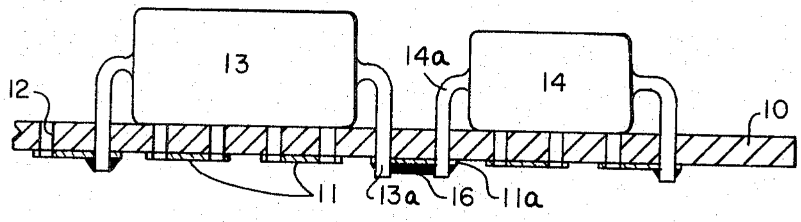
FIGURE 3 is an enlarged, partial section of FIGURE 2 on the line 3—3.

Referring initially to the embodiment of FIGURES 1 through 3, the illustrated solder board comprises a non-electro-conducting support in the form of a sheet 10 having on one side a series of soldering zones 11 uniformly spaced apart in substantially even rows. It is understood that such zones 11 extend substantially over the entire area of the sheet 10. This sheet may be composed of a dielectric such as a ceramic like glass, but resins such as phenol formaldehyde, melamine formaldehyde, etc., are preferred. The soldering zones 11 comprise a patch of solder-wettable material which is adherent to and easily wetted by a liquid soldering composition. Preferably a metal is used which aids in the fluxing action of the solder. Such metals include silver, tin, gold, and alloys thereof. Copper is preferred because of its relatively low cost and availability.

To form the soldering zones 11, a metal sheet may be suitably secured to the back 10 and then scored or ground by a cutting wheel to remove unwanted portions and leave a desired surface pattern such as is shown in FIGURE 1. Alternately, the metal may be photoetched to form the desired pattern. This manner of preparation results in substantially square patches as illustrated, but it is understood that the patches may be of other polygonal configuration or even circular or oval. In a typical solder board, such as that illustrated in FIGURE 1, the patches are approximately 3/16 inch to 1/4 inch on the side and spaced apart from about 1/32 of an inch to about 1/16 of an inch. The spacing between areas, of course, varies with the voltage range in which the board is intended to be used.

A plurality of openings 12 extend through each soldering zone and the non-conducting backing sheet. These openings may be formed by simple gang drilling or punching. Each opening is of a size to receive but one electric lead and preferably substantially frictionally engages the lead. This frees the hands of a worker to carry out other steps in assembling the circuit, such as mounting other electric components, soldering the leads, etc. However, as a result, each soldering zone must have at least three openings to receive as many leads between which a circuit is joined. To render the solder board more versatile for diverse needs in establishing a circuit, as many as four or more openings may be needed on each patch. Normally, there are junctures of as many as four or more leads at various points along an electronic circuit.

In use, as an example, while the board is supported as in a jig, the leads of electrical components 13, 14, and 15 are inserted through the openings 12 from the insulating side of the sheet 10 to protrude beyond the patches 11 and form soldering points as illustrated especially by FIGURE 3. The electric components may comprise any of various known parts such as transistors, resistors, capacitors, choke coils, relays, transformers, tubes such as diodes, triodes, pentodes, etc. The relatively heavy wire leads of electric components do not normally break even under rough handling.

The patches now serve as soldering bases. For instance, with the leads 13_a_ and 14_a_ of their respective components, 13 and 14, protruding through the patch 11_a_ (FIGURE 3), liquid solder is applied to the patch. The liquid easily "runs" over the wettable patch 11_a_, surrounding the leads 13_a_ and 14_a_ and any other lead present. But the solder does not extend beyond the perimeter of the patch 11_a_ due to the preferential attraction between the metal patch and the soldering composition. Further, when the solder solidifies, a cap 16 forms (FIGURE 3) through which the leads 13_a_ and 14_a_ are actually electrically connected rather than through the patch 11_a_. Therefore, it does not matter if the patch itself is quite thin or breaks, since it is not needed to complete the circuit.

The insulating board 10 plus the soldering provides mechanical integrity. Once the solder has congealed, it is also immaterial whether the metal patch 11 or "plating" remains stuck to the board. The board 10 provides still another advantage in that those circuit components which are subject to heat damage are located at some distance from the area at which the heat is applied for soldering. For example, some capacitors and resistors have metal caps, and some radio frequency chokes have quite thin insulation. Thus, a lead wire from the component 15, for example, is passed through an opening 12 and may be bent over and into another opening of the same or different patch and soldered at such other opening. The heat applied in soldering is also dissipated by the patch before the component 15 is affected, since the patch, particularly when it is metal, has greater heat conductance than the resinous material of the board 10. Thus the member 10 also serves to shield the component 15. At the same time it will be noted that the comparatively small size of the patches 11 permits excellent solder joints to be achieved as excessively fast heat dissipation is prevented. In this manner the patch actually controls heat dissipation.

Figure 4:
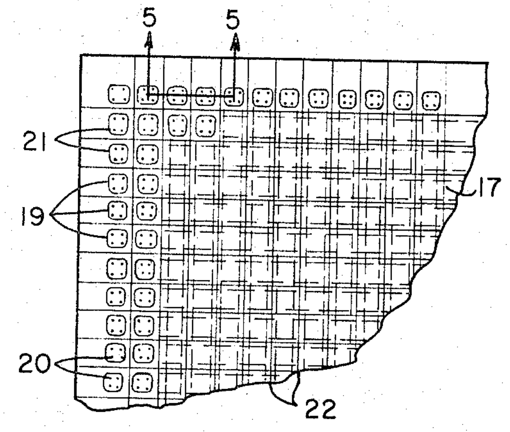
FIGURE 4 is a plan view, similar to FIGURE 1, and shows a modified form of the circuit board.
Figure 5:
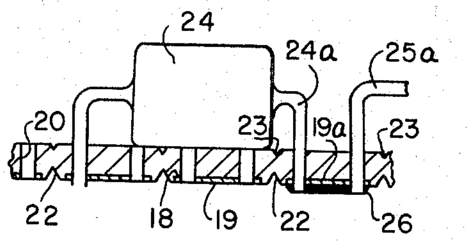
FIGURE 5 is an enlarged, partial section of FIGURE 4 on the line 5—5 and shows an electrical component mounted on the board.

FIGURES 4 and 5 illustrate a modified form of the solder board of which the modifications can be used singly or in combination.

In this embodiment, an insulating sheet 17 is used which is like the sheet 10 of FIGURES 1 through 3 in composition but different in that the soldering zones 18 are recessed or inset as best shown in FIGURE 5. The advantage of this technique is that the sheet 17 can be inexpensively and directly molded from a plastic or resin in standard dies to form a waffle pattern design in reverse. The zones 18 may be filled with metal inserts 19 as by press fitting in a gang operation, and the assembly gang-punched to form openings 20 which extend entirely through the inserts 19 and sheet 17.

By recessing the metal patches 19 into the plane of the board 17, the opportunity for electric discharge or leakage from one patch to another is considerably lessened. Also, an attendant advantage is that the corners of the zones and patches can be rounded like fillets as shown at 21 in FIGURE 4. Rounded or curved corners are desired also to reduce or eliminate corona discharge or other voltage leakage from zone to zone as is more likely to occur from and between relatively sharp corners of square soldering zones. When an insulating sheet is formed by laminating a layer of metal onto the insulating sheet and then cutting away part of the metal layer to form the spaced apart soldering zones, the realization of round-cornered zones is virtually impossible.

In this regard, a sheet with recesses is uniquely adapted for forming a solder board. For example, a layer of solder-wettable material, such as copper, may be adhered by means known in the art to a side of an electrical insulating board having the recesses in such a manner as to follow the contour of that side of the board, covering both the recesses and the relatively raised intervening areas between the recesses. Then by removing those portions deposited on the intervening areas, the recesses are readily left covered with the patch material. For instance, removal means such as a grinding wheel may be passed across the outermost plane of the board in contact with the relatively raised intervening areas and abrade away those portions of the layer covering such areas. This automatically leaves the recesses (of any shape) with an adhered patch of solder-wettable material. While the board and layer may be separately apertured or perforated and then laminated with matching apertures aligned, it is preferred for ease and accuracy to perforate the soldering zones and backing board after the two members are laminated.

As a still further guard against a molten soldering composition overflowing from a soldering patch and possibly reaching an adjacent patch, a series of grooves 22 are cut into the board. These grooves extend between the patches and at substantially right angles to each other so as entirely to encompass each patch or zone as shown in FIGURE 4.

While the present solder board may be manufactured in relatively large sizes, often only a portion of the board may be needed for a particular application. A further use of the grooves 22 resides in providing rupture lines so that the board may be broken along a chosen groove to provide a board of desired size and configuration. To facilitate the breaking action, the board preferably also has a series of grooves 23 on its other side. The grooves 23 are substantially directly opposite the grooves 22 and cooperate in providing an easier and cleaner break.

The embodiment of FIGURES 4 and 5 is used in a manner similar to that for the embodiment of FIGURES 1 through 3. An electric component 24 is seated on the side of the board having the grooves 23, and leads from the component are inserted through the openings 20 and subsequently soldered to the metal soldering zone on the other side of the board 17. For example, the lead **24*a* may be electrically joined to a lead 25*a* of another electric component by and through a soldering cap 26 held in place while liquid and until solidified by metal insert 19*a***.

In case of either illustrated embodiment, two principal advantages are: the electric components are held in place while an operator with his hands free can solder the leads or wires as described; and the components and leads can be so laid out that the soldering points formed by the leads are readily accessible.

It will now be apparent that the present invention provides an improved solder board which permits facile, economical, and secure mounting of electric components and which is convenient and durable in use. A plurality of patches, each independent of the other and defining soldering zones, are located on one surface of the board. The zones are insulated by the board itself, and each patch has openings of specific configuration. Electric components are mounted on the board on an opposite surface to that carrying the soldering zones. Lead wires extending through the board are soldered on the opposite side upon a soldering zone backing, each zone neatly retaining a liquified soldering composition until it has solidified. In the preferred form, the soldering cap formed upon solidification serves to connect electrically three or more leads, rather than relying on the soldering zone itself for this function. The soldering of the leads in this manner prevents the loosening of the electric components during handling of the board.

We claim:

1. A solder board adapted to receive a plurality of electric components for integration into a circuit by soldering or the like, said board comprising an electrically nonconductive support having two opposed sides, a plurality of spaced-apart soldering zones on one of said sides, each soldering zone comprising a patch adapted to be easily wetted by a melted solder composition or the like and effective to confine the melted solder composition within the areal confines of the patch, each patch having at least three openings substantially aligned with openings extending through the nonconductive support to the other opposed side, each patch opening being of a size to receive but one lead extending from one of said electric components when mounted with respect to said other opposed side, whereby an electrical connection is effected between at least two such leads for each patch, and a network of grooves extending substantially over the surface of said one side of the board between and among said soldering zones in such a manner as to isolate each such zone from the others, said network of grooves serving the multipurposes of aiding to retain said melted solder composition within the confines of said patch, minimizing arcing from patch to patch, and providing weakened avenues along which the solder board can be broken to produce a board of desired size and configuration.

2. The solder board of claim 1 further including an electrical component mounted with respect to said opposed side of the support and having a lead extending therefrom through the support and sufficiently beyond a defined soldering zone to form a soldering point, said point being electrically secured within said zone.

3. The solder board of claim 2 wherein the electrical connection between said at least two leads is effected by and through a solidified solder cap retained by a patch.

4. The solder board of claim 1 further containing grooves on the opposite side of the support substantially opposed to the grooves on the side containing the patches, whereby the circuit board can be broken along said opposed grooves to produce a circuit board of desired size and configuration.

5. The solder board of claim 1 wherein said patch is made of metal.

References Cited

UNITED STATES PATENTS

| | | | |
|---|---|---|---|
| 2,137,617 | 11/1938 | Imesetal | 29—155.55 |
| 2,925,645 | 2/1960 | Bell et al. | 174—68.5 X |
| 3,077,658 | 2/1963 | Wharton | 174—68.5 X |
| 3,206,322 | 9/1965 | Morgan. | |
| 3,217,208 | 11/1965 | Castro | 174—68.5 X |

FOREIGN PATENTS

| | | |
|---|---|---|
| 863,141 | 3/1961 | Great Britain. |

DARRELL L. CLAY, *Primary Examiner.*